United States Patent [19]

Brown

[11] 4,071,901
[45] Jan. 31, 1978

[54] ANALOG-TO-DIGITAL CONVERSION MEANS AND ASSOCIATED LAG COMPENSATED APPARATUS

[75] Inventor: James L. Brown, Toddville, Iowa

[73] Assignee: Rockwell International Corporation, El Segundo, Calif.

[21] Appl. No.: 739,891

[22] Filed: Nov. 8, 1976

[51] Int. Cl.$^2$ .......................... G06J 1/00; H03K 13/02
[52] U.S. Cl. ............................ 364/605; 340/347 AD; 364/571; 364/558
[58] Field of Search ........... 235/183, 150, .51, 151.32; 328/127, 165, 167; 307/229; 325/38 B; 332/11 D; 340/347 AD

[56] References Cited

U.S. PATENT DOCUMENTS

| | | | |
|---|---|---|---|
| 3,541,319 | 11/1970 | James | 235/183 |
| 3,633,004 | 1/1972 | James | 235/150.51 |
| 3,882,488 | 5/1975 | Kosakowski et al. | 235/183 |
| 3,974,365 | 8/1976 | Johnson | 235/151.32 |
| 3,978,414 | 8/1976 | Bober et al. | 328/127 |

OTHER PUBLICATIONS

Scott: Analog and Digital Computer Technology Textbook, McGraw Hill Co., 1960, Differentiator Circuit, pp. 128-129 of interest.

Primary Examiner—Felix D. Gruber
Attorney, Agent, or Firm—Richard A. Bachand; H. Fredrick Hamann

[57] ABSTRACT

A differentiating circuit comprising an operational amplifier with capacitance feedback utilizes an analog-to-digital integrator and a digital-to-analog converter in the feedback loop. Digital rate information is obtained by digitalizing the differentiator output while a digital signal indicative of the analog is obtained by summing the output of the integrator with a portion of the digital rate signal to compensate for lag occurring in the integrator output digital signal.

4 Claims, 3 Drawing Figures

ANALOG-TO-DIGITAL CONVERSION MEANS AND ASSOCIATED LAG COMPENSATED APPARATUS

THE INVENTION

The present invention is generally concerned with electronics and more specifically with A/D and D/A conversion and rate information generation.

In airplanes, static pressure indications are normally obtained from a pitot tube as an analog signal. In today's technology, it is desirable to have a digital indication of both the pressure and the rate of change of pressure. An obvious solution is to use an analog differentiator in combination with an A/D converter to obtain digital rate and to directly convert the analog signal indicative of pressure through an A/D converter to obtain the digital indication. It has been found, however, that an analog differentiator passes a considerable amount of noise which generally has a higher frequency than the rate signal and that this noise output is in some cases much larger than the differential or rate output. As may be realized, a differentiator is basically a high pass filter. Thus, the noise signals will be digitalized and appear at the output of the A/D rate converter.

A further problem of using an analog differentiator is the physical space requirements necessary to house the capacitor section of an analog integrator which will perform the appropriate differentiation time constant.

The present inventive concept utilizes an operational amplifier with an integrating feedback loop to provide the differentiation signal. The feedback loop comprises an analog-to-digital integrator and a D/A converter to provide the appropriate feedback signals. The output from the A/D integrator is indicative of the input static pressure signal $P_s$ but lags that signal and thus is designated psuedo digital $P_s$. Such an analog-to-digital integrator may be found in my copending application Ser. No. 734,689 filed Oct. 21, 1976, also assigned to the same assignee as the present invention. To obtain a signal $P_s$ which has compensation for lag, an amount of the rate output which is an inverse function of the gain of the operational amplifier is added to the psuedo digital $P_s$ to provide a compensated or true $P_s$ output. The total package is thus considerably smaller than an equivalent analog differentiator and associated pair of analog-to-digital converters required to accomplish the same end result.

It is, therefore, an object of the present invention to provide an improved differentiator.

A further object of the invention is to compensate a feedback digital signal in a hybrid differentiator to obtain a true digital output signal.

Other objects and advantages will be apparent from a reading of the specification and appended claims in conjunction with the drawings wherein:

DETAILED DESCRIPTION

Figure 1:
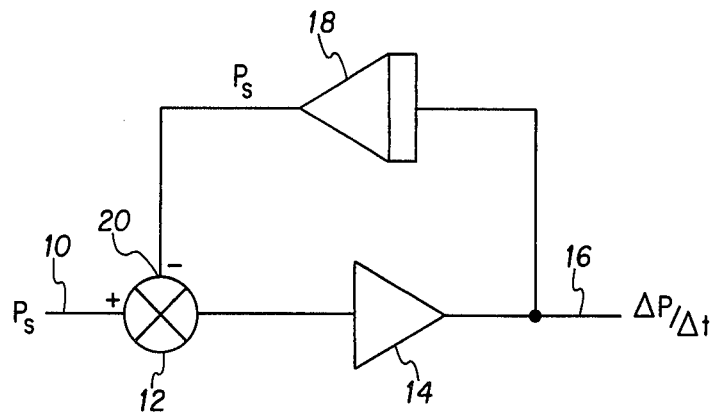
FIG. 1 is a block diagram of the prior art.

In FIG. 1, an input signal 10 is applied to a plus input of a mixer or signal combining unit 12 whose output is supplied to an operational amplifier 14 having an output 16. An integrator 18 is connected between output 16 and an inverting or minus input 20 of combiner 12.

Figure 2:
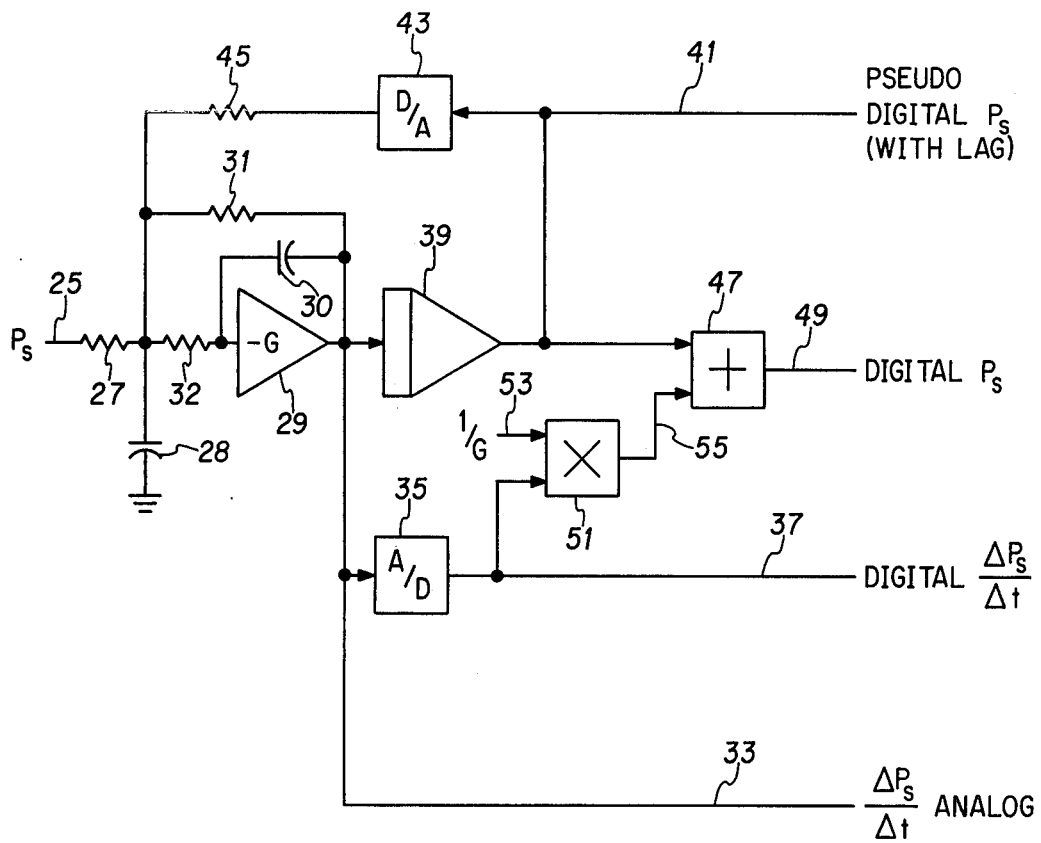
FIG. 2 is a block diagram of the inventive concept as practiced in a system concept.

In FIG. 2, an input signal $P_s$ which is indicative of static pressure is supplied to an input lead 25 for transmission through a resistor 27 to the input of an operational amplifier 29 configured as a 2-pole lowpass filter having a gain of G. An output of amplifier 29 is supplied through a feedback resistor 31 for gain stability to the input of amplifier 29 and is also supplied to an output lead 33 labeled $\Delta P_s/\Delta t$ and is indicative of the rate of change of the input signal $P_s$. This output lead is also connected through an analog-to-digital converter 35 to an output terminal labeled 37 as a digital $\Delta P_s/\Delta t$. Lead 33 is also supplied to the input of a block designated as 39 which is an analog-to-digital integrator. An output of analog-to-digital integrator 39 is supplied on a lead 41 to an output terminal labeled pseudo digitial $P_s$ (with lag). This output in the steady state the differentiator transients have settled is indicative of the input signal $P_s$ as a digital number but does lag during change of $P_s$. Lead 41 is supplied to the input of a digital-to-analog converter 43 whose output is supplied through a resistor 45 to the input of amplifier 29 in a summing arrangement with the signals supplied through resistors 27 and 31. Lead 41 is also supplied to the input of a summing circuit 47 whose output on lead 49 is labeled digital $P_s$. Lead 37 is also supplied to a multiplying circuit 51 which has an input indicative of the reciprocal of the gain of amplifier 29 on a lead 53. An output of multiplying circuit 51 is supplied on a lead 55 to a second input of summing means 47. As will be realized, the function of block 51 is to divide the output of A/D converter 35 by the amount of the gain of amplifier 29 and thus block 51 has as its equivalent a dividing circuit.

As indicated above, amplifier 29 is configured as a 2-pole lowpass filter. The components primarily comprising this filter are capacitors 28 and 30, resistor 32 and amplifier 29. The resistors 27, 31 and 45 primarily affect the gain of this filter. Such filters are well known to those skilled in the art as illustrated by a Burr-Brown Research Corporation publication entitled "Operational Amplifiers, Designs and Applications" on page 289. As used herein, this filter using amplifier 29 operates to filter both the analog output deviations of D/A converter 43 and the noise or trash input supplied along with the $P_s$ signal on 25 where these trash components are above the frequence range of interest for rate information. The filtration of the abrupt changes in analog information from D/A converter 43 is necessary to prevent false rate information from appearing on leads 33 and 37 and is accomplished through the combination of resistors 45 and the lowpass filter. As will be realized, the input noise components are removed by the combination of resistor 27 and the filter.

Figure 3:
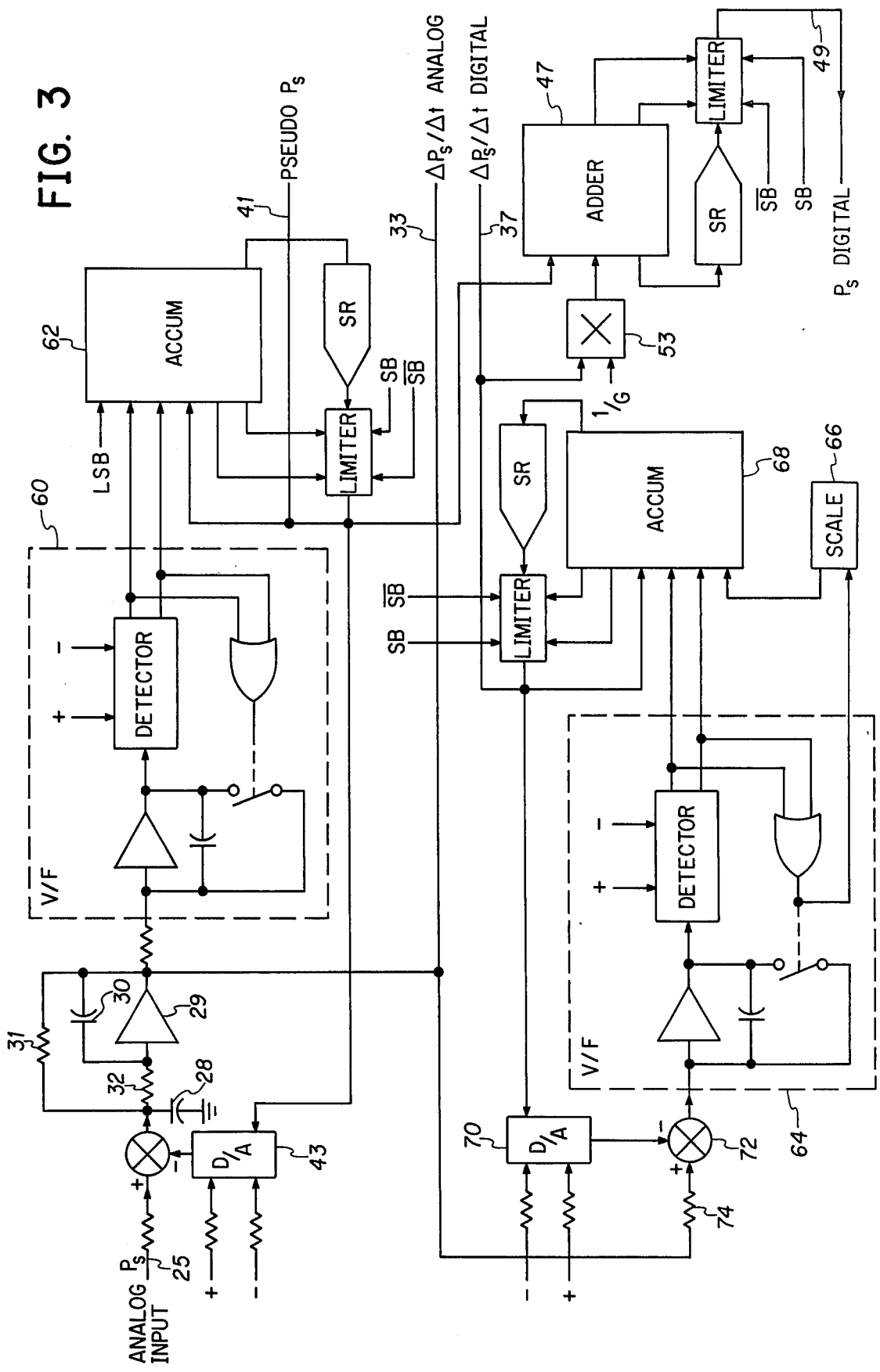
FIG. 3 is a detailed block diagram of FIG. 2 illustrating one implementation of the system of FIG. 2.

In FIG. 3, the same numbers are used as are used in FIG. 2 with the addition that the V/F converter 60 in combination with the accumulator 62 and associated circuitry form an integrator much as illustrated in the above-referenced copending application, and is equivalent to block 39 of FIG. 2. The V/F converter 64 along with scale block 66, accumulator 68 and D/A converter 70 form an A/D converter similar to that illustrated in my copending application, Ser. No. 734,492 filed Oct. 21, 1976, also assigned to the same assignee as the present invention. These four blocks and their associated circuitry form the function of A/D converter 35 of FIG. 2. The multiplier block 51 and the adder block 47 may be any of various types and include embodiments illustrated in my copending applications as well as issued patents to the assignee of the present inventive concept.

OPERATION

As indicated supra and in the drawing, FIG. 1 is illustrative of the prior art. The components 29, 39 and 43 in FIG. 2 also accomplish the same function as accomplished by FIG. 1, but for differentiators requiring a large value of integration capacity by unit 18, the present embodiment offers a much smaller physical package. Further, as indicated supra, the use of an amplifier/filter 29 and the digital electronics in the feedback loop reduce the noise appearing on output lead 33 and thus on the associated leads 37 and 49.

From observation of FIG. 2, it will be realized that the signal being fed back through D/A converter 43 to the input of amplifier 29 must, under stable conditions, be equivalent to the input signal $P_s$ supplied on lead 25. Thus, the signal on lead 41 is indicative of input 25. It does lag, and thus is labeled "psuedo digital," as a function of the effective capacitance of integrator 39. As may be ascertained from my copending application Ser. No. 734,689, referenced above, an analog-to-digital integrator as herein illustrated has an effective capacitance much larger than the actual components would indicate due to the multiplication factor obtained by the concept taught in that application.

Since the output of integrator 39 does not change rapidly, a low speed D/A converter can be used for block 43. An example of such a D/A converter is that shown in copending application bearing Ser. No. 715,775 filed Aug. 19, 1976 also assigned to the same assignee as the present invention.

The gain of amplifier 29 results in a change or downscale bit weight of the A/D converter 35 of 1/G as compared to the bit weight of D/A converter 43. In other words, the resolution of A/D converter 35 is 1/G per bit weight as compared to the bit weight of D/A converter 43.

As will be realized, the digital output 41 has a lag due to the passage of the signal through integrator 39 and it is desirable to have a more current up-to-date digital output representative of the $P_s$ input on lead 25. For this reason, the signal appearing on lead 41 is modified by adding the signal appearing on lead 55 thereto as a current digital output.

In order to obtain the digital equivalent of $P_s$, an input signal indicative of rate can be summed with $P_s$. Since $P_s$ has been amplified by operational amplifier 29, the rate signal must be first reduced by a factor of G before being combined with psuedo $P_s$ in summing means 47 to provide output 49. The digitalizing of the rate signal is straightforward using an A/D converter 35. Although the system requirements only needed digital $P_s$ and digital rate, the outputs psuedo $P_s$ and analog rate have been illustrated in view of their accessibility.

While a review of the referenced copending applications will render an explanation of FIG. 3 unnecessary, a few comments will be made. The integration of analog-to-digital integrator is accomplished by changing an analog input to a period or frequency related output, the occurrences of the period are then counted or accumulated by accumulator 62. A limiter is used to prevent the output from "rolling over" and starting from a base number in the event that the capacity of the accumulator is exceeded. The output of this integrator is then fed back on 41 through digital-to-analog converter 43 to stabilize the differentiation action.

The A/D converter 35 uses a V-F converter 64 in combination with an accumulator 68 to provide an integrating function. The scale block 66 is part of an inventive concept described in the referenced application and basically is used to change the integrating rate as a function of the amplitude of the input signal to the converter 64 from a summing circuit 72. The integrating rate is decreased as the input amplitude to the converter 64 is decreased. The output of the integrator is supplied to a D/A converter 70 and fed back to balance out the input signal supplied on lead 33.

In comparing the upper and lower portions of FIG. 3, it will be noted that the major difference is that the differentiator requires an operational amplifier but cannot use a variable integration rate while the A/D converter does not use an intermediate operational amplifier and can, although does not have to, use the variable integration rate.

In summary, the inventive concept includes a very compact digital differentiator unit, as illustrated in FIG. 2. This is accomplished by using an analog-to-digital integrator for multiplying the effect of an internal analog integrator and combining this with a D/A converter in the feedback loop of an operational amplifier. Once the signal is digitized, it can be compensated by adding a digitized version of a rate signal proportional to the input. Since the system required a digital rate signal, this is obtained from the A/D converter 35 and reduced by a factor of the gain in 29 to provide a signal on lead 49 which is digitally substantially equivalent at all times to the analog signal provided on lead 25.

While a given embodiment of the inventive concept has been illustrated, modifications and further designs will be apparent to those skilled in the art and I wish to be limited only by the scope of the appended claims.

What is claimed is:

1. Differentiating apparatus comprising:
   an amplifier having a gain of G and having an input and an output;
   signal combining means, including first and second inputs, connected to supply output signals to the input of said amplifier;
   feedback means connected between the output of said amplifier and the first input of said signal combining means, and comprising, in series, an analog-to-digital integrator, and a digital-to-analog converter;
   means for supplying an analog signal to be converted to the second input of said signal combining means;
   an analog-to-digital converter connected to the output of said amplifier for providing a digital signal output representative of the rate of change of the signal supplied to the second input of said signal combining means;
   means connected to receive digital signals from said analog-to-digital converter for providing an output signal indicative of 1/G times the received signal;
   and algebraic combining means, connected to receive the output of said integrator and from said means providing an output signal indicative of 1/G times the received signal to provide an output digitally representative of the signal supplied to the second input of said combining means, whereby said output is compensated for any lag introduced by said integrator.

2. Differentiating apparatus as claimed in claim 1 comprising in addition output means connected to an output of said integrator for providing digital signals representative of the analog signals supplied to said second input of said combining means.

3. Apparatus for compensation for digital signal lag occurring in an operational amplifier differentiator using an analog-to-digital integrator as a portion of an A/D and D/A feedback network wherein the amplifier has a gain of G comprising, in combination:

means for digitalizing the amplified and differentiated analog signal to obtain a 1/G digitalized rate signal, and means for summing said rate signal with a digital version of the signal being differentiated as obtained from the A/D feedback integrator to provide a compensated digital output signal indicative of the analog input to the apparatus.

4. The method of compensating for digital signal lag occurring in an analog-to-digital integrator portion of an A/D and D/A feedback network of an operational amplifier differentiator wherein the amplifier has a gain of G comprising, the steps of:

digitalizing the amplified analog signal to obtain a 1/G digitalized rate signal, and summing said rate signal with a digital version of the signal being differentiated as obtained from the output of the A/D feedback integrator to provide a compensated digital signal indicative of the analog input to the apparatus.

* * * * *